United States Patent [19]
York

[11] Patent Number: 5,698,965
[45] Date of Patent: Dec. 16, 1997

[54] APPARATUS AND METHOD FOR DETERMINING THE CURRENT STATE OF CHARGE OF A BATTERY BY MONITORING BATTERY VOLTAGE INCREASES ABOVE AND DECREASES BELOW A THRESHOLD

[75] Inventor: Robert A. York, Dillsburg, Pa.

[73] Assignee: Flight Systems, Inc., Lewisberry, Pa.

[21] Appl. No.: 673,851

[22] Filed: Jul. 1, 1996

Related U.S. Application Data

[60] Provisional application No. 60/007,860, Dec. 1, 1995.

[51] Int. Cl.$^6$ .......................... H01M 10/44; H01M 10/46
[52] U.S. Cl. ................................. 320/30; 320/48
[58] Field of Search .......................... 320/5, 12, 13, 320/14, 21, 30, 32, 39, 40, 43, 44, 48; 324/427, 433; 340/636; 429/90

[56] References Cited

U.S. PATENT DOCUMENTS

| | | | |
|---|---|---|---|
| D. 288,791 | 3/1987 | Bezikos. | |
| 3,286,253 | 11/1966 | Leng. | |
| 3,621,359 | 11/1971 | Schnegg | 320/43 |
| 3,622,857 | 11/1971 | Sethi | 320/14 |
| 3,676,770 | 7/1972 | Sharaf et al. | 320/43 X |
| 3,727,074 | 4/1973 | Keller et al. | 320/43 X |
| 3,740,636 | 6/1973 | Hogrefe et al. | 320/2 |
| 3,743,939 | 7/1973 | Munt. | |
| 3,932,797 | 1/1976 | York | 320/48 |
| 3,934,188 | 1/1976 | York | 320/48 |
| 4,012,681 | 3/1977 | Finger et al. | 320/14 |
| 4,017,724 | 4/1977 | Finger. | |
| 4,186,339 | 1/1980 | Finger. | |
| 4,193,026 | 3/1980 | Finger et al. . | |
| 4,388,618 | 6/1983 | Finger | 320/48 X |
| 4,460,870 | 7/1984 | Finger | 320/48 X |
| 4,514,694 | 4/1985 | Finger. | |
| 4,560,937 | 12/1985 | Finger | 320/39 X |
| 4,712,195 | 12/1987 | Finger. | |
| 4,724,332 | 2/1988 | Finger | 320/40 X |
| 4,740,754 | 4/1988 | Finger | 320/48 X |
| 4,852,104 | 7/1989 | Finger. | |
| 5,406,188 | 4/1995 | Myslinski et al. | 320/14 |
| 5,451,881 | 9/1995 | Finger | 320/48 X |

FOREIGN PATENT DOCUMENTS

| | | |
|---|---|---|
| 1207394 | 9/1970 | United Kingdom. |
| 1247986 | 9/1971 | United Kingdom. |
| 1262016 | 2/1972 | United Kingdom. |

*Primary Examiner*—Edward Tso
*Attorney, Agent, or Firm*—Panitch Schwarze Jacobs & Nadel, P.C.

[57] ABSTRACT

An apparatus and method for determining a current state of charge of a battery are disclosed. The apparatus includes a battery signal developer, a threshold developer, a comparator, and a bi-directional integrating device. The battery signal developer receives a battery voltage and develops a corresponding battery signal. The threshold developer receives an integration result signal based on an integration value representative of the current state of charge of the battery, and develops a threshold signal based on the integration value. The comparator provides first and second comparison signals, respectively, when the battery signal magnitude is greater than and less than the threshold signal magnitude. The integrating device accumulates the integration value and receives a comparison result signal based on the first and second comparison signals. The integrating device adjusts the integration value in first and second opposite directions, respectively, when the first and second comparison signals are being provided by the comparator to reflect both increases and decreases in the current state of charge of the battery.

18 Claims, 6 Drawing Sheets

APPARATUS AND METHOD FOR DETERMINING THE CURRENT STATE OF CHARGE OF A BATTERY BY MONITORING BATTERY VOLTAGE INCREASES ABOVE AND DECREASES BELOW A THRESHOLD

FIELD OF THE INVENTION

The present invention relates generally to the measurement of the state charge of a battery. More particularly, the present invention relates to a method and apparatus that monitors both voltage gains above a threshold and voltage reductions below a threshold in a rechargeable storage battery to determine the current state of charge of the battery, that displays such current state of charge, and that prevents the battery from discharging below a predetermined charge level.

BACKGROUND OF THE INVENTION

It is generally well known that many types of industrial equipment utilize a rechargeable storage battery as the primary energy source. Typically, the majority of such equipment is mobile, and includes industrial fork lift trucks, underground mining vehicles, maintenance platforms, and certain tow tractors such as those used to move large airplanes away from airport gates. Depending upon the equipment and the application, energy may be drawn from the storage battery in the equipment intermittently or continuously over extended periods of time.

As should be understood, a typical rechargeable industrial battery is a lead-acid battery similar to that found in an automobile, although the rated voltage of the industrial battery may range from less than 18 to more than 84 volts DC. Such an industrial battery can be expected to last a relatively long period of time, on the order of 5 to 7 years or 1500 to 2100 charge / discharge cycles, unless the battery is subject to overcharging, undercharging, low electrolyte levels, and/or deep discharge cycles.

Overcharging a battery can cause the electrolyte levels within the battery cells to decrease below an acceptable level. At such low levels, portions of the plates within the cells become exposed. The exposed portions can then cause overheating and the active material (typically lead peroxide) on the positive plates can be damaged. Undercharging a battery does not return all of the active material to the positive plates, and can cause residual sulfation.

Deep discharge occurs in a battery when energy continues to be drawn after the battery has reached a predetermined discharge limit. During deep discharge, an excessive amount of active material leaves the positive plates, and all of the active material is not returned during future charging. The loss of such active material reduces the effective plate area of the battery, decreases battery charge capacity, shortens battery life, and increases internal battery resistance. Over time, the lost active material may settle to the bottom of the battery cells as a lead sulfate, pile up, and contact and short out one or more sets of cell plates.

Accordingly, and for the reasons stated above, it is highly desirable that the actual current state of charge of a battery be continuously determined, and that such determined current state of charge be employed to help prevent overcharging, undercharging, and especially deep discharge of the battery.

SUMMARY OF THE INVENTION

The present invention is an apparatus and method for determining a current state of charge of a battery having a battery voltage by monitoring both battery voltage increases above a threshold and battery voltage decreases below a threshold. The apparatus includes a battery signal developer, a threshold developer, a comparator, and a bi-directional integrating device.

The battery signal developer has an input for receiving the battery voltage and develops a battery signal having a magnitude corresponding to the battery voltage. The threshold developer has an input for receiving an integration result signal based on an integration value having a magnitude representative of the current state of charge of the battery, and developing a threshold signal having a magnitude based on the magnitude of the integration value.

The comparator has inputs for receiving the battery signal and the threshold signal, and providing a first comparison signal when the magnitude of the battery signal is greater than the magnitude of the threshold signal and a second comparison signal when the magnitude of the battery signal is less than the magnitude of the threshold signal. The bi-directional integrating device accumulates the integration value and has an input for receiving a comparison result signal based on the first comparison signal and the second comparison signal.

The integrating device adjusts the integration value in a first direction when the first comparison signal is being provided by the comparator to reflect an increase in the current state of charge of the battery. Correspondingly, the integrating device adjusts the integration value in a second direction opposite from the first direction when the second comparison signal is being provided by the comparator to reflect a decrease in the current state of charge of the battery.

BRIEF DESCRIPTION OF THE DRAWINGS

The foregoing summary, as well as the following detailed description of a preferred embodiment of the invention, will be better understood when read in conjunction with the appended drawings. For the purpose of illustrating the invention, there is shown in the drawings an embodiment which is presently preferred. It should be understood, however, that the invention is not limited to the precise arrangements and instrumentalities shown. In the drawings.

DETAILED DESCRIPTION OF PREFERRED EMBODIMENTS

Figure 1:
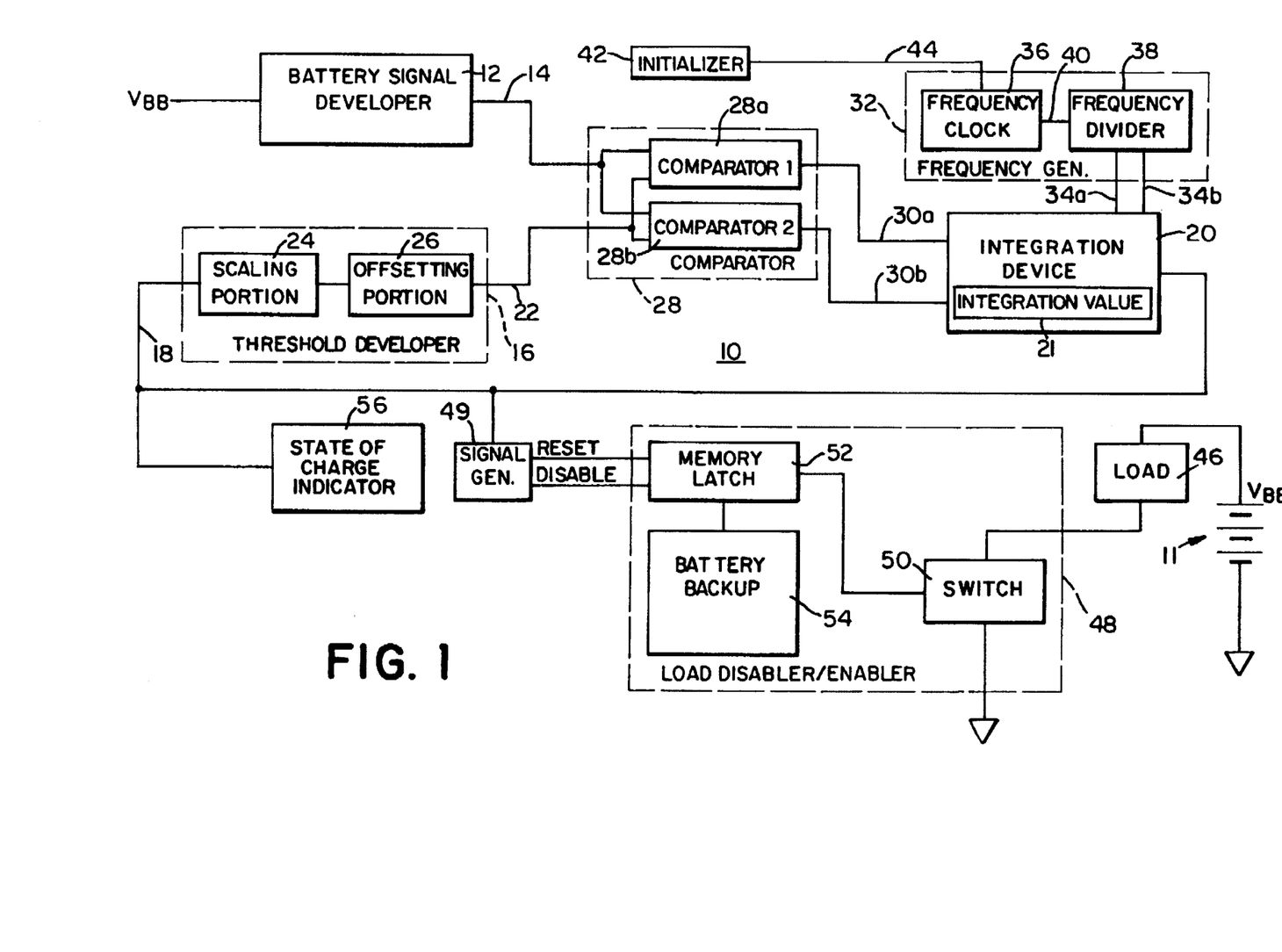
FIG. 1 is a blocked diagram of an apparatus for determining a current state of charge of a battery in accordance with the preferred embodiment of the present invention.

Referring to the drawings in detail, wherein like numerals are used to indicate like elements throughout, there is shown in FIG. 1 a preferred embodiment of an apparatus 10 for determining a current state of charge of a battery 11 having a rated battery voltage and a current battery voltage $V_{BB}$. As should be understood, the rated battery voltage is fixed and is based primarily on the number of cells in the battery 11, and the battery voltage $V_{BB}$ varies based on factors including the battery state of charge, the battery temperature, the internal battery resistance of the battery, and the type and amount of battery load or battery charge. Since the rated battery voltage of the battery 11 may typically range from below 18 to above 84 volts DC, the apparatus 10 includes a battery signal developer 12 with an input for receiving the battery voltage $V_{BB}$, where the battery signal developer 12 develops a battery signal 14 having a magnitude corresponding to the battery voltage $V_{BB}$.

Figure 2:
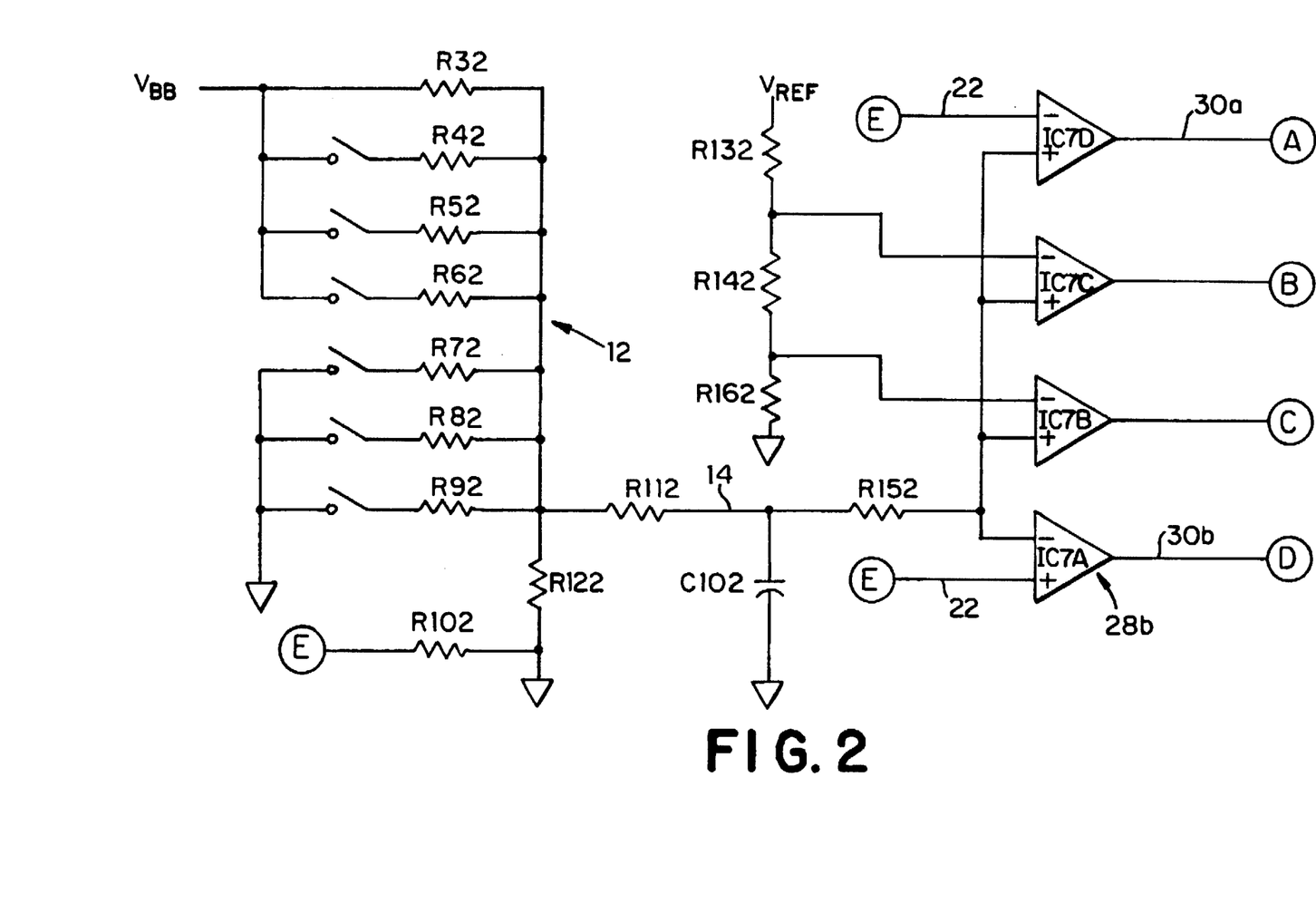
FIGS. 2–7 are circuit diagrams corresponding to the apparatus shown in FIG. 1.

As seen in FIG. 2, the battery signal developer 12 includes a programmable voltage divider formed by resistors R32, R42, R52, R62, R72, R82, R92, and R122, three switches that selectively connect resistors R42, R52, and R62 to the battery voltage $V_{BB}$, and three switches that selectively connect resistors R72, R82, and R92 to ground. As should be understood, the divider scales the battery voltage $V_{BB}$ by a predetermined factor based on the settings of the six switches such that the scaled version of the battery voltage $V_{BB}$ is in a more amenable range for sampling purposes. The proper settings for the six switches for each rated battery voltage are arrived at by well-known means. The scaled version of the battery voltage $V_{BB}$ appears across R122 and is low-pass filtered by resistor R112 and capacitor C102 to produce the battery signal 14.

One skilled in the art will recognize that other battery signal developing devices may be employed without departing from the spirit and scope of the present invention. For example, an operational amplifier with adjustable gain (not shown) may be employed to produce a battery signal 14 from the battery voltage $V_{BB}$, as may any of several other well-known voltage adjusting devices.

Referring again to FIG. 1, the apparatus 10 also includes a threshold developer 16 having an input for receiving an integration result signal 18 based on an integration value 21 having a magnitude representative of the current state of charge of the battery 11. The threshold developer 16 develops a threshold signal 22 having a magnitude based on the magnitude of the integration value 21. As seen, the integration result signal 18 is derived from an integration device 20 having the integration value 21. The integration device 20 will be described below.

Preferably, the threshold developer 16 includes a scaling portion 24 that scales the integration result signal 18 in a predetermined manner, and an offsetting portion 26 that offsets the integration result signal 18, also in a predetermined manner. Accordingly, the threshold signal 22 is a scaled, offset representation of the magnitude of the integration value 21.

Figure 3:
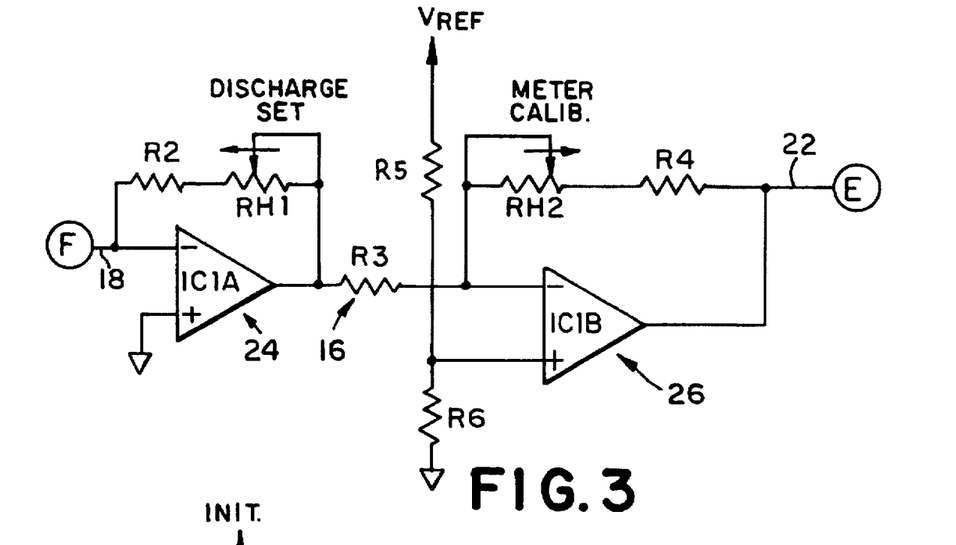

Referring now to FIG. 3, it is seen that in the preferred embodiment of the present invention, the scaling portion 24 of the threshold developer 16 includes an operational amplifier IC1A, a resistor R2, and a variable resistor RH1 combined in a manner well-known to one skilled in the art to convert a current signal (the integration result signal 18) to a scaled voltage signal at the output of the operational amplifier IC1A. The offsetting portion 26 is formed by the operational amplifier IC1B, the resistors R3–R6, and the variable resistor RH2, again combined in a manner well-known to one skilled in the art. As configured in FIG. 3, the offsetting portion 26 further scales the scaled voltage signal at the output of the operational amplifier IC1A and offsets the further scaled signal to produce the threshold signal 22 at the output of the operational amplifier IC1B.

It will be appreciated by one skilled in the art that other types of scaling and offsetting means may be employed to develop the threshold signal 22 without departing from the spirit and scope of the present invention. For example, the integration result signal 18 may be produced as a voltage signal by appropriate means, two resistors of appropriate value may be placed in series between such voltage signal and a reference voltage, and the threshold signal 22 may be tapped from between the two resistors.

Referring again to FIG. 1, the apparatus 10 of the present invention also includes a comparator 28 having inputs for receiving the battery signal 14 and the threshold signal 22.

The comparator provides a first comparison signal 30a when the magnitude of the battery signal 14 is greater than the magnitude of the threshold signal 22, and a second comparison signal 30b when the magnitude of the battery signal 14 is less than the magnitude of the threshold signal 22. Preferably, and as shown, the comparator 28 includes a first comparator 28a for providing the first comparison signal 30a, and a second comparator 28b for providing the second comparison signal 30b.

Referring again to FIG. 2, it is seen that in the preferred embodiment of the present invention, comparators IC7D and IC7A each receive the threshold signal 22 and the battery signal 14. Comparator IC7D is the first comparator 28a and outputs the first comparison signal 30a when the magnitude of the battery signal 14 is greater than the magnitude of the threshold signal 22. Correspondingly, comparator IC7A is the second comparator 28b and outputs the second comparison signal 30b when the magnitude of the battery signal 14 is less than the magnitude of the threshold signal 22.

One skilled in the art will recognize that the first and second comparison signals 30a, 30b may be developed by other means without departing from the spirit and scope of the present invention. For example, in an alternative embodiment, only one comparator may be employed, where the first and second comparison signals 30a, 30b are provided as different states of the output of the one comparator.

Referring again to FIG. 1, the integration device 20 of the apparatus 10 has an input for receiving a comparison result signal based on the first and second comparison signals 30a, 30b. The integration device 20 maintains the integration value 21, as was discussed above, and adjusts the integration value 21 in a first direction when the first comparison signal 30a is being provided by the comparator 28 to reflect an increase in the current state of charge of the battery 11. Correspondingly, the integrating device 20 adjusts the integration value 21 in a second, opposite direction when the second comparison signal 30b is being provided by the comparator 28 to reflect a decrease in the current state of charge of the battery 11.

Preferably, the integrating device 20 increases the integration value 21 when the first comparison signal 30a is being provided by the comparator 28, and decreases the integration value 21 when the second comparison signal 30b is being provided by the comparator 28. Accordingly, the magnitude of the integration value 21 decreases when the current state of charge of the battery decreases, and increases when the current state of charge of the battery 11 increases. However, one skilled in the art will recognize that the integrating device 20 may be operated to decrease the magnitude of the integration value 21 when the current state of charge of the battery 11 increases, and to increase the magnitude of the integration value 21 when the current state of charge of the battery 11 decreases, without departing from the spirit and scope of the present invention, if such an operation is deemed advisable.

Figure 4:
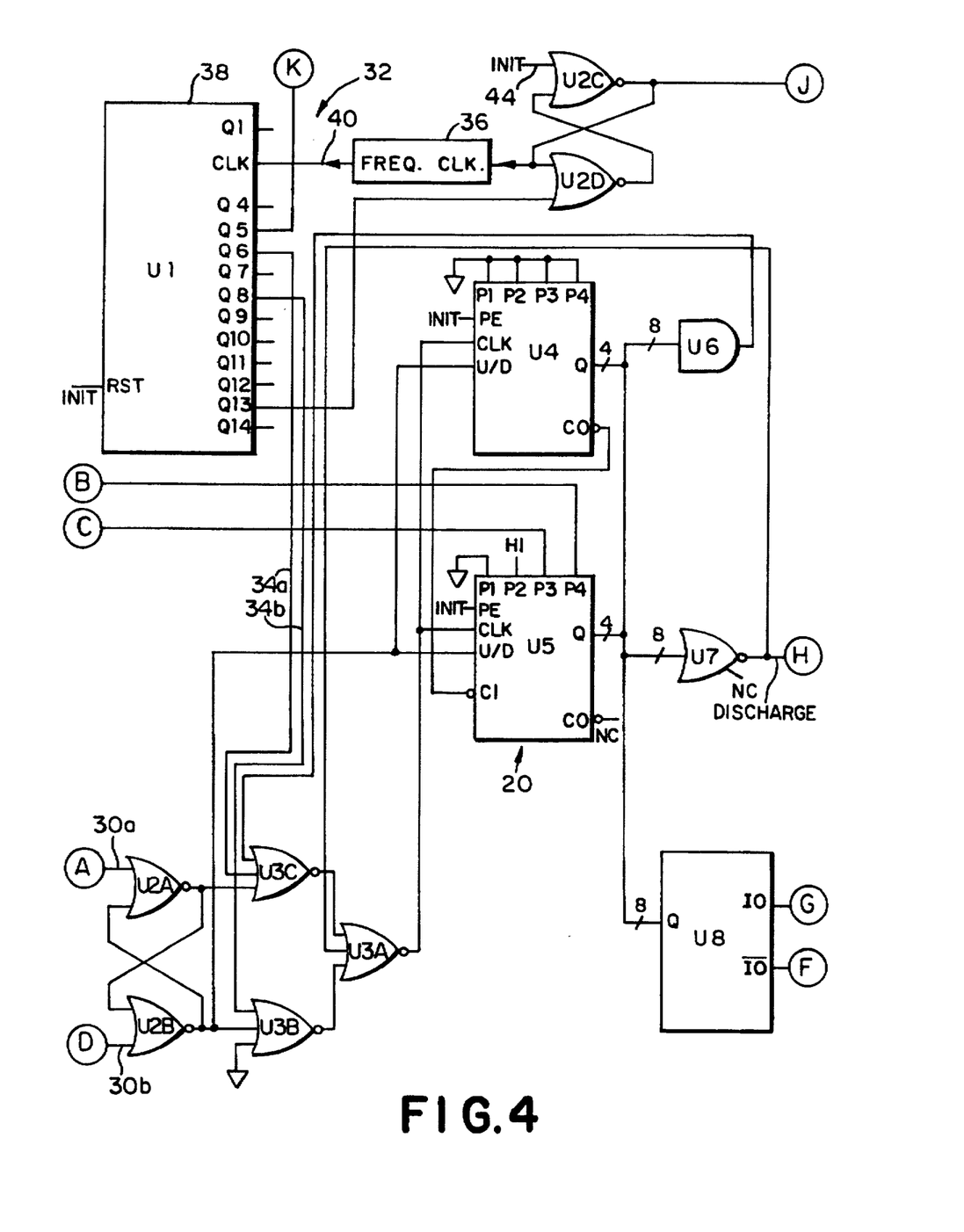

Referring now to FIG. 4, it is seen that in the preferred embodiment of the present invention, the integrating device 20 includes a pair of 4-bit counters U4, U5 combined to form an eight-bit counter U4/U5 for storing a binary number with a decimal equivalent of from 0 to 255. The counter U4/U5 is initialized with a predetermined value, as will be described below, and then clocks up or down from the pre-determined value, as determined by logic circuitry including NOR gates U2A, U2B, U3A, U3B, and U3C, and a frequency generator 32. As seen in FIGS. 1 and 4, the frequency generator 32 provides a first frequency signal 34a having a first predetermined frequency rate and a second frequency signal 34b having a second predetermined frequency rate.

As seen, NOR gates U2A and U2B are combined to form a latch U2A/U2B with the first and second comparison signals 30a, 30b from the comparator 28 as the latch inputs. Accordingly, a momentary reception of the first comparison signal 30a sets the latch in a first state and a momentary reception of the second comparison signal 30b sets the latch in a second state. NOR gates U3A, U3B, and U3C are interconnected with each other and with the latch U2A/U2B, the counter U4/U5, and the frequency generator 32 such that the counter U4/U5 counts up at a first rate when the latch U2A/U2B is in the first state and down at a second rate when the latch U2A/U2B is in the second state.

More specifically, and as should be understood from the circuit in FIG. 4, when the first comparison signal 30a causes the latch U2A/U2B to be in the first state, the counter U4/U5 counts up according to the first frequency rate of the first frequency signal 34a, and when the second comparison signal 30b causes the latch U2A/U2B to be in the second state, the counter U4/U5 counts down according to the second frequency rate of the second frequency signal 34b.

Preferably, the output of the counter U4/U5 is received by an AND gate U6 and by a NOR gate U7, each gate receiving as inputs all eight bits from the counter U4/U5. The outputs of the gates U6 and U7 are fed back to the logic circuitry including NOR gates U3A, U3B, and U3C. As should be appreciated, gates U6 and U7 prevent "roll over" of the counter U4/U5 by detecting when all bits are high or low, respectively, and inhibiting further clocking that would cause the stored binary number to clock up from 255 to 0 or down from 0 to 255.

Also preferably, the 8-bit digital integration value 21 from the counter U4/U5 is input to a digital-to-analog converter (DAC) U8 which converts the digital integration value 21 into proportional current signal IO and complementary proportional current signal ĪŌ. As seen in FIGS. 3 and 4, complementary proportional current signal ĪŌ is supplied to the scaling portion 24 of the threshold developer 16 as the integration result signal 18. As should now be understood, the counter U4/U5 and the DAC U8 of FIG. 4, the threshold developer 16 of FIG. 3, and the battery signal developer 12 and comparators 28a, 28b of FIG. 2 form a feedback loop that seeks to adjust the integration value 21 in the counter U4/U5 up or down, as necessary, in order to match the threshold signal 22 to the battery signal 14.

Referring again to FIG. 1, it is preferable that the frequency generator 32 include a frequency clock 36 and a frequency divider 38. The frequency clock 36 provides a base frequency signal having a predetermined base frequency rate. The frequency divider has an input for receiving the base frequency signal 40, and divides the base frequency signal 40 a number of times to produce the first frequency signal 34a. The frequency divider 38 additionally divides the first frequency signal 34a a further number of times to produce the second frequency signal 34b.

Referring again to FIG. 4, it is seen that the frequency divider 38 is a counter U1, where the clocking input of the counter receives the base frequency signal 40. As should be understood, the Q1 bit of the counter U1 changes state at a frequency rate equal to the base frequency rate divided by two, the Q2 bit (not shown) changes state at a rate equal to the base frequency rate divided by four, and so forth. As seen in FIG. 4, the first frequency signal 34a is tapped from bit Q6 and the second frequency signal 34b is tapped from the bit Q8 such that the first frequency rate of the first frequency signal 34a is four times the second frequency rate of the second frequency signal 34b. Accordingly, the counter U4/U5 counts up at a rate four times faster than the down rate.

One skilled in the art will recognize that other types of frequency generators may be employed without departing from the spirit and scope of the present invention. For example, other bits on the counter U1 may be tapped, if so desired.

Referring again to FIG. 1, it is seen that the apparatus 10 also includes an initialize detect device or initializer 42 for generating an initialize signal (INIT) 44 when the battery 11 is initially connected to the apparatus 10. Preferably, the initialize signal (INIT) 44 is provided for a predetermined period of time to reset and initialize the apparatus 10.

As one skilled in the art will recognize, the initializer 42 may be any of a number of means capable of connected to the apparatus 10. For exile, the initializer producing an output signal when the battery 11 is initially connected to the apparatus 10. For example, the initializer 42 may include an RC (resistor-capacitor) charging circuit, where the initialize signal 44 is provided until the capacitor in the RC circuit is charged beyond a set level.

Referring now to FIG. 4, it is seen that two NOR gates U2C, U2D form a latch U2C/U2D, that the initialize signal (INIT) 44 is applied to gate U2C of the latch U2C/U2D, and that the output of gate U2C is applied to the frequency clock 36 of the frequency generator 32. Preferably, the frequency clock 36 provides a frequency signal having a first predetermined frequency rate for a period of time beginning when the initialize signal (INIT) 44 is received, and a second predetermined frequency rate thereafter. Also preferably, the first frequency rate provided by the frequency clock 36 is higher than the second frequency rate. Preferably, the first frequency rate provided by the frequency clock 36 is about 1360 hertz and the second frequency rate provided by the frequency clock 36 is about 64 hertz.

As should be appreciated, the integrating device 20 which includes the counter U4/U5 adjusts the integration value 21 according to the frequency signal produced by the frequency clock 36. Accordingly, when the frequency clock 36 provides the frequency signal at the higher first frequency rate, the first and second frequency signals 34a, 34b provided by the counter U1 are correspondingly higher in rate, and when the frequency clock 36 provides the frequency signal at the lower second frequency rate, the first and second frequency signals 34a, 34b provided by the counter U1 are correspondingly lower in rate.

Referring again to FIG. 1, it is seen that a load 46 is normally placed across the battery 11, and that the apparatus 10 further has a load disabler/enabler 48 that enables and disables the load 46 once the current state of charge of the battery 11 has decreased to a predetermined disable level. As should be understood, the load 46 may be a fork lift actuator, a traction motor or any of a large number of other types of loads. Preferably, the load disabler 48 enables and disables a load that draws a substantial amount of energy from the battery 11, such as a fork lift actuator. Also preferably, low-draw loads (indicator lights, e.g.) and "critical" loads (a traction motor, e.g.) are not enabled and disabled by the load disabler 48. Accordingly, such low-draw loads and "critical" loads are operable even after the current state of charge of the battery 11 has decreased to the disable level.

The load disabler 48 has an input for receiving a DISABLE signal provided when the integration value 21 shows that the current state of charge of the battery 11 has decreased to the disable level. When the load disabler 48 receives the DISABLE signal, the load 46 is prevented from drawing power from the battery 11.

Preferably, the load disabler 48 also has an input for receiving a RESET signal provided when the integration value 21 shows that the current state of charge of the battery has increased to a predetermined reset level. Accordingly, when the RESET signal is received, the load disabler re-enables a disabled load 46 to draw power from the battery 11. Preferably, a signal generator 49 provides the RESET and DISABLE signals based on the output of the integration device 20.

Preferably, the load disabler 48 includes a switch 50 in series with the load 46 for selectively disabling and enabling the load 46, and the switch 50 is controlled by a substantially non-volatile memory device or memory latch 52 for storing and retaining the DISABLE signal. Preferably, the load disabler 48 also includes a battery back-up 54 to provide power to the memory latch 52 in the event that the battery 11 is disconnected from the apparatus 10.

More specifically, it is seen that when the integration value 21 in the counter U4/U5 an FIG. 4 decreases to zero, signifying that the current state of charge of the battery 11 has decreased to the discharge level, the zero integration value causes the NOR gate U7 to output a DISCHARGE signal. NOR gates IC4A and IC4C in FIG. 6 form a latch IC4A/IC4C, and the DISCHARGE signal from the NOR gate U7 in FIG. 4 is applied to set the latch IC4A/IC4C. In turn, the output of the latch IC4A/IC4C controls the switch 50 formed by the transistor Q2 such that the set latch IC4A/IC4C causes the switch 50 to be open, and the load 46 is prevented from drawing power from the battery 11.

Figure 5:
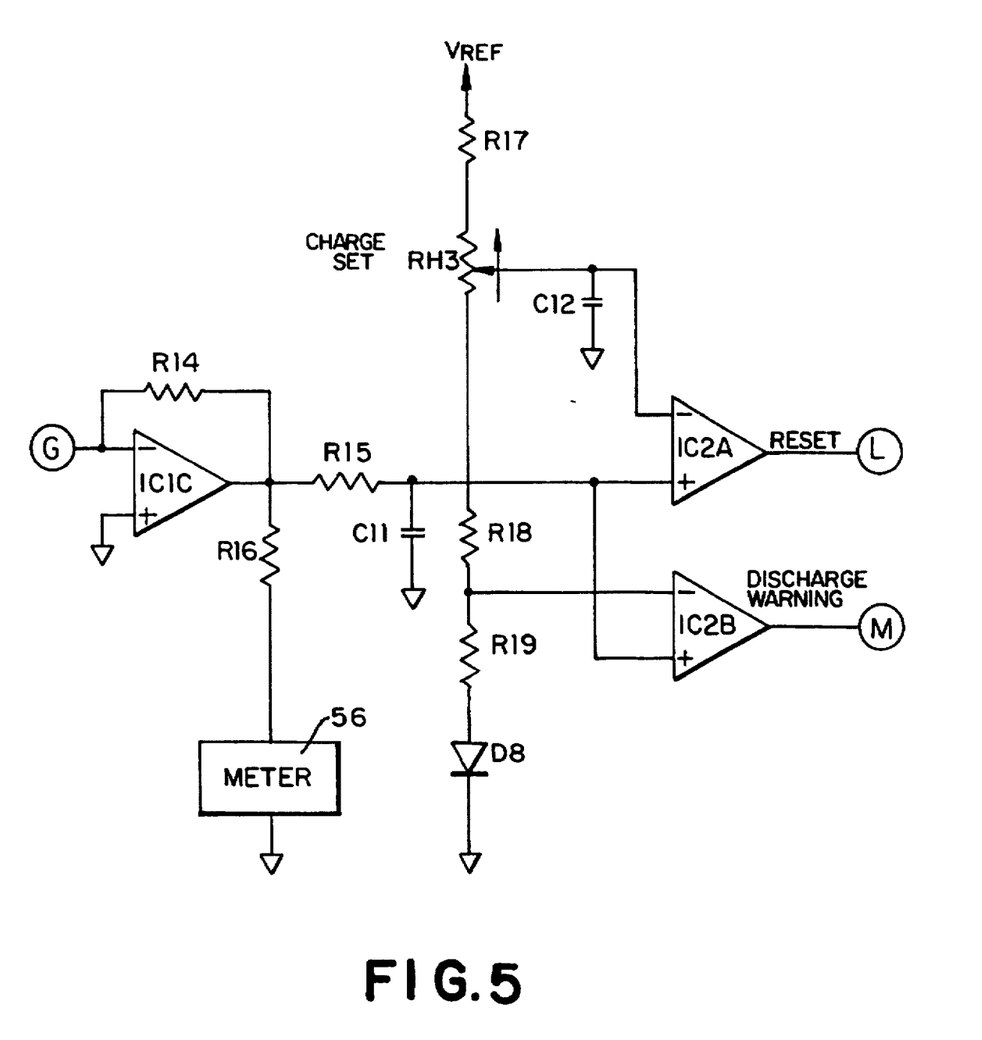
Figure 6:
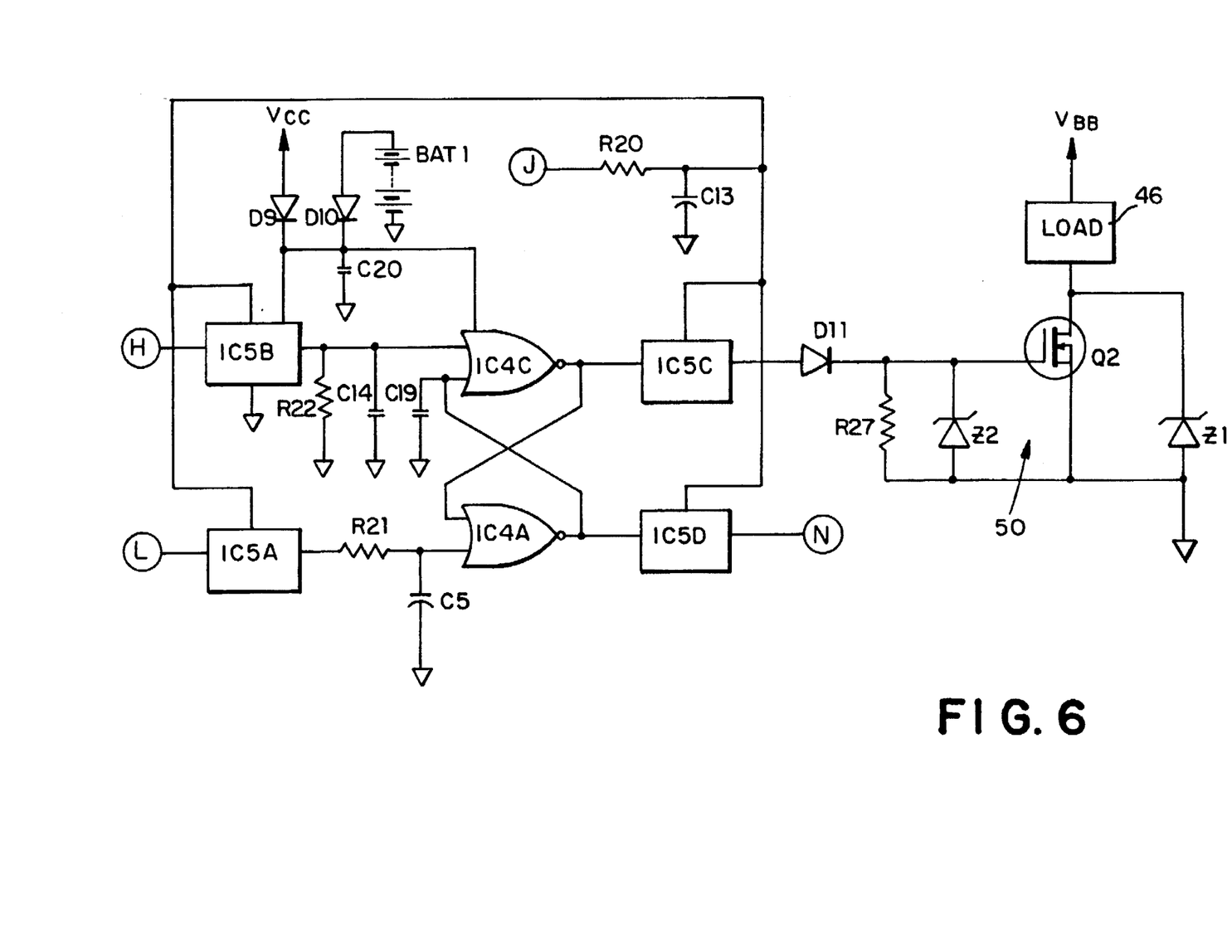

The latch IC4A/IC4C in FIG. 6 is reset only when the integration value 21 in the counter U4/U5 in FIG. 4 has increased to the predetermined reset level. More specifically, the proportional current signal IO from DAC U8, which as was discussed above is proportional to the integration value 21 in the counter U4/U5, is converted into a proportional voltage signal by the operational amplifier IC1C in FIG. 5, and the voltage signal is low-pass filtered by resistor R15 and capacitor C11.

Variable resistor RH3, resistors R18, R19, and diode D8 are placed in series across voltage $V_{REF}$, and the center terminal of variable resistor RH3 is tapped to provide a predetermined reset comparison voltage. The reset comparison voltage and the filtered voltage signal from the operational amplifier IC1C are compared by way of comparator IC2A in FIG. 5, and a RESET signal is generated if the filtered voltage signal is greater than the reset comparison voltage, signifying that the integration value 21 and the current state of charge of the battery have increased to the reset level.

The RESET signal from the comparator IC2A in FIG. 5 is received by gate IC4A of the latch IC4A/IC4C in FIG. 6 to reset the latch IC4A/IC4C. When reset, the latch IC4A/IC4C causes the switch 50 to be closed such that the formerly disabled load 46 can now draw power from the battery 11.

Referring again to FIG. 1, it is preferable that the apparatus 10 have a state of charge indicator or meter 56 for providing a visual indication of the current state of charge of the battery 11. As seen, the indicator or meter 56 receives an input based on the integration value 21 accumulated by the integration device 20. As seen in FIG. 5, it is preferable that the meter tap the voltage signal output from the operational amplifier IC1C. Preferably, the meter represents the current state of charge of the battery 11 in the form of a "fuel gauge" that reads "empty" when the integration value 21 from the counter U4/U5 in FIG. 4 is zero and "full" when the integration value 21 is 255.

The operation of the apparatus 10 described above is as follows. When a battery 11 is first connected to the apparatus 10, an initialize signal (INIT) 44 is generated by the initializer 42. The INIT signal initializes the counter U1 and the counter U4/U5 in FIG. 4, and causes the latch U2C/U2D in FIG. 4 to assume a "LEARN" state during which the frequency clock 36 provides a frequency signal having the higher first frequency rate. Consequently, the first and second frequency signals 34a, 34b have a corresponding higher frequency and the counter U4/U5 is operated at a relatively higher speed during the "LEARN" mode.

The output of gate U2C of the latch U2C/U2D of FIG. 4 is forwarded to transmission gates IC5A-IC5D of FIG. 6. As should be understood, during the "LEARN" mode, the transmission gates IC5A-IC5D are placed in a non-conducting state to isolate the latch IC4A—IC4C in FIG. 6 such that anomalous signals cannot inadvertently reset the latch IC4A-IC4C and enable the load 46 during that period of time.

During the "LEARN" mode, the battery signal 14 is compared with preset voltage values at comparators IC7B and IC7C of FIG. 2. As seen, the preset voltage values are derived from taps on resistors R132, R142, R162 serially positioned between a reference voltage $V_{REF}$ and ground. Accordingly, the comparators IC7B and IC7C can respectively assume one of three state: 0 and 0 if the battery signal 14 is in a low range, 0 and 1 if the battery signal 14 is in a medium range, and 1 and 1 if the battery signal 14 is in a high range. The outputs of the comparators IC7B and IC7C are employed to develop an initial value to be loaded into the counter U4/U5.

More particularly, and as seen in FIG. 4, the output of comparator IC7C is received by the preset P4 of counter U5, the output of IC7B is received by preset P3 of counter U5, preset P2 of counter U5 is held high, and preset P1 of counter U5 and presets P4-P1 of counter U4 are held low. Accordingly, presets P4-P1 of counter U5 and P4-P1 of counter U4 form an initial integration value 21 that is loaded into the counter U4/U5 in response to the initialize signal (INIT) 44. As a result, the counter U4/U5 may be initialized to 00100000 (20H), 01100000 (60H), or 1111100000 (EOH) based on whether the battery signal 14 is in the low, medium, or high range. As should be understood, the initial integration value 21 loaded into the counter U4/U5 is an initial estimate of the integration value 21.

Figure 7:
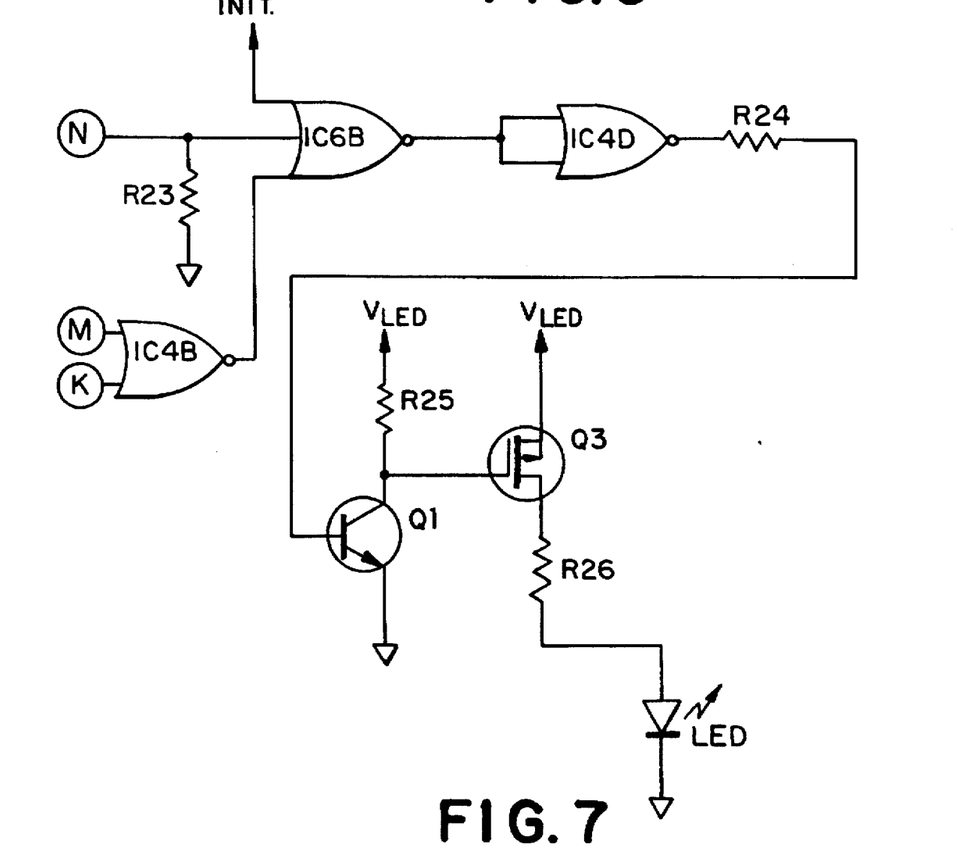

Referring now to FIG. 7, it is seen that the apparatus 10 preferably includes a discharge indicator light or LED that is driven through transistors Q1, Q3, and that the LED is driven according to the pulsed signal at bit Q5 of counter U1 in FIG. 4 by way of gates IC4B, IC6B, IC4D of FIG. 7. During the "LEARN" mode and when the initialize signal (INIT) 44 is present, gate IC6B is enabled by the initialize signal (INIT) 44 and the LED is pulsed according to the pulsed signal at bit Q5 of counter U1. Preferably, the frequency clock 36 is operating at a high enough rate such that the bit Q5 of the counter U1 pulses the LED at a high-enough rate so as to appear to be "on steady".

As soon as the initialize signal (INIT) 44 ends, the counter U4/U5 of FIG. 4 is loaded with an initial value as determined by comparators IC7C and IC7B of FIG. 2, and the counter U1 of FIG. 4 and the counter. U4/U5 are released for counting at the relatively higher speed according to the higher first frequency rate of the frequency clock 36. Although the initialize signal (INIT) 44 has ended, the frequency clock 36 does not operate at the lower second frequency rate until the latch U2C/U2D of FIG. 4 is reset to end the "LEARN" mode. Since the frequency clock 36 is operating at the higher first frequency rate during the "LEARN" mode, and the counter U4/U5 is consequently operated at a relatively higher speed, the feedback loop formed by the counter U4/U5 and the DAC U8 of FIG. 4, the threshold developer 16 of FIG. 3, and the battery signal developer 12 and comparator 28 of FIG. 2 should achieve equilibrium in a relatively short period of time, preferably on the order of a few seconds, and the meter 56 almost immediately displays the current state of charge of the battery 11.

The "LEARN" mode continues until bit Q13 of counter U1 in FIG. 4 resets the latch U2C/U2D to begin a "TRACK" mode. When the "TRACK" mode commences, the frequency clock 36 begins to operate at the second, lower frequency rate and the counter U4/U5 is operated at a relatively lower speed, and the transmission gates IC5A–IC5D in FIG. 6 assume their conductive states to enable manipulation of the latch IC4A/IC4C. The enabled latch IC4A/IC4C is not set or reset, but is merely able to receive the DISABLE and RESET signals described above. If the latch IC4A/IC4C was previously set to disable the load 46, such latch will not be reset and the load 46 will not be re-enabled unless the current state of charge in the battery is sufficient to provide a RESET signal at the output of comparator IC2A. If the latch IC4A/IC4C does not reset, the output of gate IC4A causes the discharge warning LED of FIG. 7 to be "full on" to advise an operator that the apparatus 10 has not reset and that the load 46 is not enabled.

During "TRACK" mode, the apparatus 10 continues to track the battery signal 14 (i.e., the battery voltage $V_{BB}$) up or down under all working conditions. Once the current state of charge of the battery 11 decreases to a predetermined level (preferably about five percent of scale) as determined by the comparator IC2B of FIG. 5, such comparator will enable the discharge warning LED of FIG. 7 to flash according to the pulsed signal provided by bit Q5 of counter U1 of FIG. 4. The flashing of the LED notifies the operator that load disabling is near. Although the discharge warning LED is flashing, the load 46 is not disabled until the DISCHARGE signal is provided by the gate U7 of FIG. 4. If the current state of charge of the battery 11 recovers to a sufficient degree, the flashing will stop.

The battery 11 is allowed to be discharged until the counter U4/U5 of FIG. 4 reaches a count of zero. As was described above, such zero count causes the NOR gate U7 of FIG. 4 to set the latch IC4A/IC4C of FIG. 6, thus turning transistor Q2 off and preventing the load 46 from drawing power from the battery 11. Even if the battery 11 is lifted out or disconnected from the equipment having the apparatus 10, the state of the latch IC4A/IC4C is maintained indefinitely by way of a back-up battery BAT1. Accordingly, the apparatus 10 cannot be reset by momentarily disconnecting the battery 11.

The apparatus 10 as described above can be operated continuously and will accurately present the current state of charge of the battery 11 during battery discharging and charging conditions. Regardless of whether a disconnected battery has been fully recharged, partially recharged, or not charged at all, when the battery 11 is connected to the apparatus 10, the apparatus 10 will determine the current state of charge of the battery 11 and the meter 56 will display the current state of charge within a relatively short period of time on the order of a few seconds. Additionally, the battery 11 may be opportunity charged in place and the apparatus 10 will accurately record the charge gained during such opportunity charging. Further, the apparatus 10 will also accurately record charge gains that occur naturally during periods of rest.

From the foregoing description, it can be seen that the present invention comprises a new and useful apparatus and method for measuring the current state of charge of a battery by monitoring battery voltage gains above and reductions below a threshold. It will be appreciated by those skilled in the art that changes could be made to the embodiment described above without departing from the broad inventive concepts thereof. It is understood, therefore, that this invention is not limited to the particular embodiment disclosed, but is intended to cover modifications within the spirit and scope of the present invention as defined by the appended claims.

I claim:

1. An apparatus for determining a current state of charge of a battery having a battery voltage, comprising:

a battery signal developer having an input for receiving the battery voltage, the battery signal developer for developing a battery signal having a magnitude corresponding to the battery voltage;

a threshold developer having an input for receiving an integration result signal based on an integration value having a magnitude representative of the current state of charge of the battery, the threshold developer for developing a threshold signal having a magnitude based on the magnitude of the integration value;

a comparator having inputs for receiving the battery signal and the threshold signal, the comparator for providing a first comparison signal when the magnitude of the battery signal is greater than the magnitude of the threshold signal and a second comparison signal when the magnitude of the battery signal is less than the magnitude of the threshold signal;

a bi-directional integrating device for accumulating the integration value, the integrating device having an input for receiving a comparison result signal based on the first comparison signal and the second comparison signal, the integrating device for adjusting the integration value in a first direction when the first comparison signal is being provided by the comparator to reflect an increase in the current state of charge of the battery, the integrating device for adjusting the integration value in a second direction opposite from the first direction when the second comparison signal is being provided by the comparator to reflect a decrease in the current state of charge of the battery;

an initialize detect device for generating an initialize signal when the battery is initially connected to the apparatus; and a frequency generator having an input for receiving the initialize signal, the frequency generator for providing a frequency signal having a first predetermined frequency rate for a period of time beginning when the initialize signal is received and a second predetermined frequency rate thereafter, the first frequency rate being higher than the second frequency rate, the integrating device adjusting the integration value according to the frequency signal.

2. The apparatus of claim 1 wherein the threshold developer comprises a scaling portion and an offsetting portion such that the threshold signal is a scaled, offset representation of the magnitude of the integration value.

3. The apparatus of claim 1 wherein the integrating device increases the integration value when the first comparison signal is being provided by the comparator and decreases the integration value when the second comparison signal is being provided by the comparator.

4. The apparatus of claim 3 further comprising a frequency generator for providing a first frequency signal having a first predetermined frequency rate and a second frequency signal having a second predetermined frequency rate, wherein the integrating device decreases the integration value according to the first frequency signal and increases the integration value according to the second frequency signal.

5. The apparatus of claim 4 wherein the frequency generator comprises:
   a frequency clock for providing a base frequency signal having a predetermined base frequency rate; and
   a frequency divider having an input for receiving the base frequency signal, the frequency divider for dividing the base frequency signal a number of times to produce the first frequency signal and for dividing the first frequency signal a further number of times to produce the second frequency signal.

6. The apparatus of claim 4 wherein the comparator comprises a first comparator and a second comparator each having inputs for receiving the battery signal and the threshold signal, the first comparator and the second comparator for respectively providing the first comparison signal and the second comparison signal.

7. The apparatus of claim 1 wherein a load is placed across the battery, the apparatus further comprising a load disabler having an input for receiving a disable signal provided when the integration value shows that the current state of charge of the battery has decreased to a predetermined disable level, the load disabler for disabling the load from drawing power from the battery when the disable signal is received.

8. The apparatus of claim 7 wherein the load disabler further includes an input for receiving a reset signal provided when the integration value shows that the current state of charge of the battery has increased to a predetermined reset level, the load disabler for re-enabling the disabled load to draw power from the battery when the reset signal is received.

9. The apparatus of claim 7 wherein the load disabler further includes a substantially non-volatile memory device for storing and retaining the disable signal.

10. A method for determining a current state of charge of a battery having a battery voltage, the method comprising the steps of:
   developing a battery signal having a magnitude corresponding to the battery voltage;
   developing a threshold signal having a magnitude based on an integration value having a magnitude representative of the current state of charge of the battery;
   providing a first comparison signal when the magnitude of the battery signal is greater than the magnitude of the threshold signal;
   providing a second comparison signal when the magnitude of the battery signal is less than the magnitude of the threshold signal;
   adjusting the integration value in a first direction when the first comparison signal is being provided to reflect an increase in the current state of charge of the battery;
   adjusting the integration value in a second direction opposite from the first direction when the second comparison signal is being provided to reflect a decrease in the current state of charge of the battery;
   generating an initialize signal when the battery is initially connected to an apparatus for determining the current state of charge; and
   providing a frequency signal having a first predetermined frequency rate for a period of time beginning when the initialize signal is generated and a second predetermined frequency rate thereafter, the first frequency rate being higher than the second frequency rate, the integration value being adjusted according to the frequency signal.

11. The method of claim 10 wherein the developing a threshold step comprises the steps of scaling the magnitude of the integration value and offsetting the magnitude of the integration value such that the threshold signal is a scaled, offset representation of the magnitude of the integration value.

12. The method of claim 10 wherein the adjusting steps comprise the steps of increasing the integration value when the first comparison signal is being provided and decreasing the integration value when the second comparison signal is being provided.

13. The method of claim 12 wherein the adjusting steps comprise the steps of decreasing the integration value at a first frequency rate when the second comparison signal is being provided and increasing the integration value at a second frequency rate when the first comparison signal is being provided.

14. The method of claim 13 further comprising the steps of:
   providing a base frequency signal having a predetermined base frequency rate;
   dividing the base frequency signal a number of times to produce a first frequency signal having the first frequency rate; and
   dividing the first frequency signal a further number of times to produce a second frequency signal having the second frequency rate.

15. The method of claim 13 wherein the providing steps comprise the steps of:
   providing a first comparison signal from a first comparator when the magnitude of the battery signal is greater than the magnitude of the threshold signal; and
   providing a second comparison signal from a second comparator when the magnitude of the battery signal is less than the magnitude of the threshold signal.

16. The method of claim 10 wherein a load is placed across the battery, the method further comprising the step of disabling the load from drawing power from the battery when the integration value shows that the current state of charge of the battery has decreased to a predetermined disable level.

17. The method of claim 16 further comprising the step of preventing re-enabling of the disabled load until the integration value shows that the current state of charge of the battery has increased to a predetermined reset level.

18. The method of claim 16 wherein a disable signal is provided when the current state of charge of the battery has decreased to the predetermined disable level, the method further comprising the step of storing and retaining the disable signal in a substantially non-volatile memory device.

* * * * *